US008969930B2

(12) United States Patent
Yin et al.

(10) Patent No.: US 8,969,930 B2
(45) Date of Patent: Mar. 3, 2015

(54) GATE STACK STRUCTURE, SEMICONDUCTOR DEVICE AND METHOD FOR MANUFACTURING THE SAME

(75) Inventors: Haizhoou Yin, Poughkeepsie, NY (US); Zhijiong Luo, Poughkeepsie, NY (US); Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 612 days.

(21) Appl. No.: 13/321,886

(22) PCT Filed: Apr. 6, 2011

(86) PCT No.: PCT/CN2011/000581
§ 371 (c)(1),
(2), (4) Date: Nov. 22, 2011

(87) PCT Pub. No.: WO2011/124088
PCT Pub. Date: Oct. 13, 2011

(65) Prior Publication Data
US 2012/0061738 A1    Mar. 15, 2012

(30) Foreign Application Priority Data
Apr. 7, 2010   (CN) .......................... 2010 1 0142125

(51) Int. Cl.
*H01L 29/78* (2006.01)
*H01L 21/28* (2006.01)
*H01L 29/66* (2006.01)

(52) U.S. Cl.
CPC .... *H01L 21/28247* (2013.01); *H01L 29/66545* (2013.01); *H01L 29/78* (2013.01)
USPC ................ 257/288; 257/E29.22; 257/E21.19; 438/592

(58) Field of Classification Search
None
See application file for complete search history.

(56) References Cited

U.S. PATENT DOCUMENTS

| 6,977,228 B2 * | 12/2005 | Kohyama et al. ............. 438/706 |
| 2006/0003524 A1 | 1/2006 | Krasemann |
| 2007/0257302 A1 * | 11/2007 | Kang et al. .................... 257/315 |

FOREIGN PATENT DOCUMENTS

CN    101099233 A    1/2008

OTHER PUBLICATIONS

International Search Report PCT/CN2011/000581.

* cited by examiner

*Primary Examiner* — Wensing Kuo
(74) *Attorney, Agent, or Firm* — Troutman Sanders LLP (57) ABSTRACT

A gate stack structure comprises an isolation dielectric layer formed on and embedded into a gate. A sidewall spacer covers opposite side faces of the isolation dielectric layer, and the isolation dielectric layer located on an active region is thicker than the isolation dielectric layer located on a connection region. A method for manufacturing the gate stack structure comprises removing part of the gate in thickness, the thickness of the removed part of the gate on the active region is greater than the thickness of the removed part of the gate on the connection region so as to expose opposite inner walls of the sidewall spacer; forming an isolation dielectric layer on the gate to cover the exposed inner walls. There is also provided a semiconductor device and a method for manufacturing the same. The methods can reduce the possibility of short-circuit occurring between the gate and the second contact hole and can be compatible with the dual-contact-hole process.

8 Claims, 5 Drawing Sheets

GATE STACK STRUCTURE, SEMICONDUCTOR DEVICE AND METHOD FOR MANUFACTURING THE SAME

CLAIM OF PRIORITY

This application is a National Stage application of, and claims priority to, PCT Application No. PCT/CN2011/000581, filed on Apr. 6, 2011, entitled "Gate Stack Structure, Semiconductor Device and Method for Manufacturing the Same", which claimed priority to Chinese Application No. 201010142125.X, filed on Apr. 7, 2010. Both the PCT Application and Chinese Application are incorporated herein by reference in their entireties.

FIELD OF THE INVENTION

The present invention relates to the technical field of semiconductor, in particular to a gate stack structure, a semiconductor device and a method for manufacturing the same.

BACKGROUND OF THE INVENTION

As the critical dimension of the semiconductor device is getting smaller continuously, the size of the contact hole (CA) is also getting smaller and smaller, and the distance between the gate and the contact hole also reduces accordingly.

Figure 1:
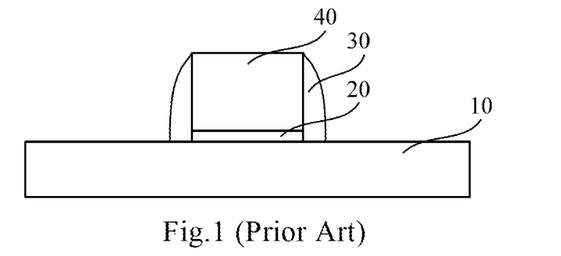
FIG. 1 is a structure schematic view of the gate stack structure in the prior art.
Figure 2:
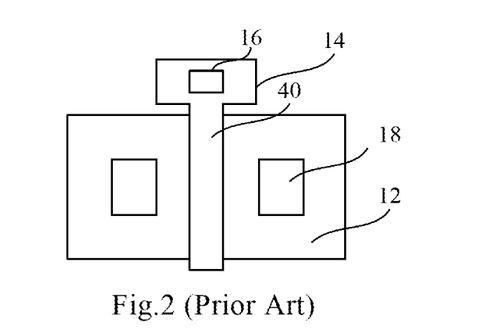
FIG. 2 is a top view of the device structure in the prior art.

One of the projects that major semiconductor corporations and research organizations all over the world compete to research and develop is the gate engineering research of CMOS device. In general, as shown in FIG. 1, a gate stack structure comprises a gate dielectric layer 20 formed on a substrate 10, a gate 40 formed on the gate dielectric layer 20, and a sidewall spacer 30 surrounding the gate dielectric layer 20 and the gate 40. The gate 40 mostly uses a metal gate. As shown in FIG. 2, the gate 40 is located on an active region 12 and a connection region 14 of the substrate 10. The gate 40 located on the active region 12 is used to adjust the device performance, and the gate 40 located on the connection region 14, the contact hole 16 formed on the connection region 14 as well as the contact hole 18 formed on the active region 12 are used to form a metal interconnection.

Figure 3:
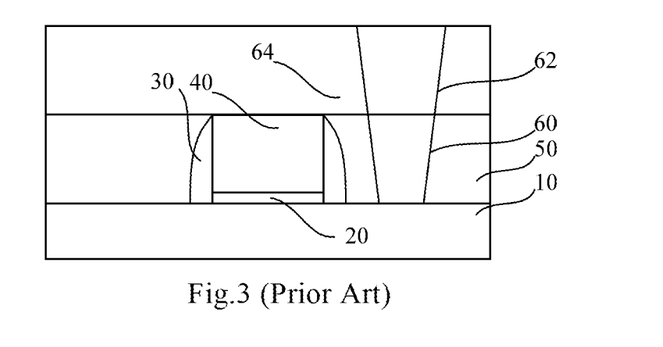
FIG. 3 is a structure schematic view after forming the first layer of metal interconnection in the prior art.

As shown in FIG. 3, after forming the gate stack structure, a first contact hole 60 that is of the same height as the gate stack structure is formed, then a second contact hole 62 is formed on the first contact hole 60 (the second contact hole 62 and the first contact hole 60 together forming the contact hole in the same interlayer dielectric layer 50) so as to form a first layer of metal interconnection. The process of forming the contact hole is divided into two steps (which is simply referred to as dual-contact-hole process herein) to facilitate the reduction of the depth-to-width ratio of the contact hole during the etching, thereby reducing defects such as incomplete etching and hole filling.

However, in the above-mentioned process, with reference to FIGS. 1 and 2, the second contact hole 62 is very close to the gate 40 located on the active region 12, so short-circuit is prone to occur between the second contact hole 62 and the gate 40 in practice owing to limitation of the process (as indicated by dashed line 64 in FIG. 3).

SUMMARY OF THE INVENTION

To solve the above problem, the present invention provides a gate stack structure and a method for manufacturing the same, which reduces the possibility of short-circuit occurring between a second contact hole and a gate. The present invention also provides a semiconductor device and a method for manufacturing the same, which reduces the possibility of short-circuit occurring between the second contact hole and the gate in the semiconductor device.

The present invention provides a gate stack structure, which comprises:
a gate dielectric layer formed on an active region and on a connection region in a substrate;
a gate formed on the gate dielectric layer; and
a sidewall spacer surrounding the gate dielectric layer and the gate;
wherein the gate stack structure further comprising:
an isolation dielectric layer formed on and embedded into the gate,
and wherein the sidewall spacer covers opposite side faces of the isolation dielectric layer, and the isolation dielectric layer located on the active region is thicker than the isolation dielectric layer located on the connection region.

Alternatively, the isolation dielectric layer is only located on the active region.

Alternatively, when a barrier layer is introduced into a device including the gate stack structure, the material of the isolation dielectric layer is different from the material of the barrier layer.

Alternatively, the isolation dielectric layer is one of silicon nitride, silicon carbon nitride, doped or undoped silicon oxide glass, and dielectric materials of a low dielectric constant, or any combination thereof.

The present invention provides a method for manufacturing a gate stack structure, which comprises the steps of:
forming a gate dielectric layer, a gate formed on the gate dielectric layer, and a sidewall spacer surrounding the gate dielectric layer and the gate on a substrate including an active region and a connection region;
wherein the method further comprising:
removing part of the gate in thickness, wherein the thickness of the removed part of the gate on the active region is greater than the thickness of the removed part of the gate on the connection region so as to expose opposite inner walls of the sidewall spacer; and
forming an isolation dielectric layer on the gate to cover the exposed inner walls.

Alternatively, the step of removing part of the gate in thickness comprises only removing part of the gate in thickness located on the active region.

Alternatively, when a barrier layer is introduced after forming the gate stack structure, the material of the isolation dielectric layer is different from the material of the barrier layer.

Alternatively, the isolation dielectric layer is one of silicon nitride, silicon carbon nitride, doped or undoped silicon oxide glass, and dielectric material of a low dielectric constant, or any combination thereof.

The present invention provides a semiconductor device which comprises the above-mentioned gate stack structure.

The present invention provides a method for manufacturing a semiconductor device, which comprises the steps of:
forming a gate stack structure on a substrate; and
forming a metal interconnection on the substrate having the gate stack structure is formed;
wherein the gate stack structure is formed using the above-mentioned method.

Compared to the prior art, the technical solution provided by the present invention has the following advantages:
By embedding the isolation dielectric layer into the gate, and making the sidewall spacer cover the opposite side faces of the isolation dielectric layer, the isolation dielectric layer located on the active region is thicker than the isolation dielectric layer on the connection region, thereby increasing the vertical distance between the gate on the active region and the second contact hole, and forming an isolation zone between said gate and the second contact hole to reduce possibility of short-circuit occurring between said gate and the second contact hole. Meanwhile, for the gate located on the connection region, the thickness of the isolation dielectric layer formed on said gate is adjusted to be as small as possible, so that the process can be compatible with the dual-contact-hole process when etching the second contact hole.

By making the isolation dielectric layer to be located only on the active region, while reducing possibility of short-circuit occurring between the gate and the second contact hole, no isolation dielectric layer is formed on the gate located on the connection region, so that the process can be better compatible with the dual-contact-hole process when etching the second contact hole.

By making the material of the isolation dielectric layer to be different from that of the barrier layer, the damage to the isolation dielectric layer can be minimized when etching the barrier layer to form the second contact hole, which facilitates to ensure isolation effect between the gate and the second contact hole.

DETAILED DESCRIPTION OF THE PREFERRED EMBODIMENTS

The following disclosure provides many different embodiments or examples for realizing the technical solution provided by the present invention. Although components and configurations of specific examples are described in the following text, they are merely examples and are not intended to limit the present invention.

In addition, reference numbers and/or letters can be repeated in different embodiments in the present invention for the purpose of concision and clarity, which in itself does not indicate the relationship between the various embodiments and/or configurations that are discussed.

The present invention provides examples of various specific processes and/or materials, but substitution of other processes and/or other materials occurred to those skilled in the art is apparently within the protection scope of the present invention. It shall be noted that the boundaries of the various regions mentioned in this specification include the necessary extension that is made out of the need of process.

Figure 4:
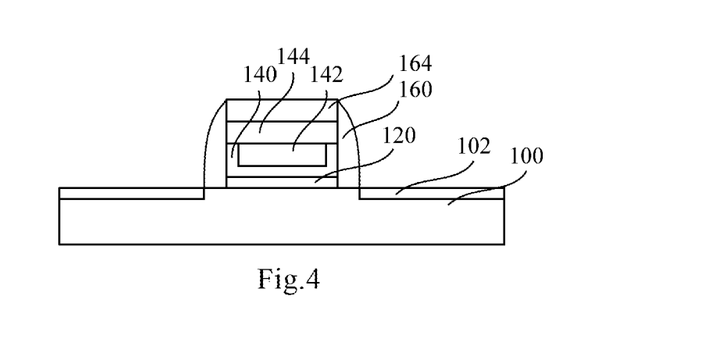
FIG. 4 is a structure schematic view of a first embodiment of the gate stack structure of the present invention in the active region.

As shown in FIG. 4, in the first embodiment of the gate stack structure of the present invention, the gate stack structure comprises: a gate dielectric layer 120 formed on a substrate 100, a gate formed on the gate dielectric layer 120, and a sidewall spacer 160 surrounding the gate dielectric layer 120 and the gate. The gate comprises a work function metal layer 140, a metal layer 142 and an auxiliary metal layer 144, wherein the work function metal layer 140 being formed on the gate dielectric layer 120 and extending toward the inner wall of the sidewall spacer 160, the metal layer 142 being formed on the work function metal layer 140, and the auxiliary metal 144 being formed on the metal layer 142 and having a resistivity smaller than that of the metal layer 142. An isolation dielectric layer 164 is formed only on the auxiliary metal layer 144 located within an active region of the substrate, and the sidewall spacer 160 covers the opposite side faces of the isolation dielectric layer 164.

Here, the substrate 100 refers to the substrate that has been subjected to a processing including precleaning, forming a well region and forming a shallow trench isolation region. The region surrounded by the shallow trench isolation region is the active region for forming the gate for controlling the device performance, source and drain regions, and part of the metal interconnection. The gate is also formed on the shallow trench isolation region, and is used to replace the gate located at the active region to achieve the metal interconnection. Thus, in this document, the region where the gate that is used to achieve the metal interconnection is located is called the connection region. The substrate may comprise a silicon wafer or other compound semiconductors, such as silicon carbide, gallium arsenide, indium arsenide, or indium phosphide. In addition, the substrate preferably comprises an epitaxial layer. The substrate may also comprise a silicon-on-insulator (SOI) structure.

The gate dielectric layer 120 may use a hafnium-based material, such as one of $HfO_2$, HfSiO, HfSiON, HfTaO, HfSiO and HfZrO, or any combination thereof. The sidewall spacer 160 may include one of silicon nitride, silicon oxide, silicon oxynitride, and silicon carbide, or any combination thereof. The sidewall spacer 160 may have a multi-layer structure. Conventional technologies may be used to perform the above-mentioned processing and to form the gate dielectric layer 120 and the sidewall spacer 160.

In the present embodiment, the gate may be formed by a dummy-gate process, namely, a dummy-gate is formed first using polysilicon, subsequently, a sidewall spacer surrounding the dummy-gate is formed, then the dummy-gate is removed to form a gate region in the region surrounded by the inner walls of the sidewall spacer, and the work function metal layer, metal layer and auxiliary metal layer are filled into the gate region to form the gate.

The work function metal layer 140 may include one of TiN, TiAlN, TaN and TaAlN, or any combination thereof. The metal layer 142 and the auxiliary metal layer 144 may include one of Al, Ti, Ta, W and Cu, or any combination thereof. Before forming the gate, a lightly doped drain region (LDD), source and drain regions and a contact region have been formed on the substrate according to the process requirement. The contact region 102 is mostly a metal silicide so as to realize a better contact between the silicon and the subsequently deposited conductive material when adopting the silicon substrate. The metal material formed on the substrate in order to form the metal silicide includes one of Co, Ni, Mo, Pt and W, or any combination thereof. The work function metal layer 140, the metal layer 142 and the auxiliary metal layer 144 may be formed by sputtering, pulsed laser deposition (PLD), metal organic chemical vapor deposition (MOCVD), atomic layer deposition (ALD), plasma enhanced atomic layer deposition (PEALD) or other appropriate technologies.

Dry etching techniques such as reactive ion etching (RIE) or wet etching techniques may be used to remove part of the auxiliary metal layer 144 in thickness, so that an isolation dielectric layer 164 is formed on the gate and the sidewall spacer 160 covers the opposite side faces of the isolation dielectric layer 164. The part of the auxiliary metal layer 144 that is to be removed in thickness can be determined flexibly according to the device performance and process requirements, as long as the part of the auxiliary metal layer 144 removed in thickness can provide an accommodation space in which the isolation dielectric layer 164 is formed so as to form an additional isolation zone between the gate and the second contact hole.

It shall be noted that in the present embodiment, the auxiliary metal layer 144 is adopted for reducing the gate resistance. As an example, the ratio between the thickness of the auxiliary metal layer 144 and the height of the sidewall spacer 160 may be greater than or equal to 20%, and the ratio between the thickness of the isolation dielectric layer 164 and the height of the sidewall spacer 160 may be greater than or equal to 15% in the present embodiment. In other embodiments of the gate stack structure, the gate may include only the work function metal layer 140 and the metal layer 142, in this case, part of the work function metal layer 140 and the metal layer 142 may be removed in thickness by dry etching techniques such as reactive ion etching (RIE) or wet etching techniques, so that the isolation dielectric layer 164 is formed on the gate (in this case, the ratio between the thickness of the isolation dielectric layer 164 and the height of the sidewall spacer 160 is greater than or equal to 15%), and the sidewall spacer 160 covers the opposite side faces of the isolation dielectric layer 164. The part of the work function metal layer 140 and the metal layer 142 that is to be removed in thickness can be determined flexibly according to the device performance and process requirements, as long as the part of the work function metal layer 140 and the metal layer 142 removed in thickness can provide an accommodation space in which the isolation dielectric layer 164 is formed so as to form an additional isolation zone between the gate and the second contact hole.

The isolation dielectric layer 164 may be one of silicon nitride, silicon carbon nitride, doped or undoped silicon oxide glass (e.g. fluorosilicate glass, borosilicate glass, phosphosilicate glass, boron-phosphorosilicate glass, silicon oxycarbide, silicon carbon oxynitride, etc.) and dielectric material of a low dielectric constant (e.g. framesite, coral, etc.), or any combination thereof. The isolation dielectric layer 164 may be formed by chemical vapor deposition (CVD), PLD, ALD, PEALD or other appropriate technologies.

After forming the gate stack structure, in order to form a semiconductor device, a barrier layer, an interlayer dielectric layer and a second contact hole embedded into the barrier layer and the interlayer dielectric layer need to be further formed. The barrier layer will cover the isolation dielectric layer, and the material of the barrier layer may be silicon nitride or silicon carbon nitride.

In the present embodiment, the material of the isolation dielectric layer 164 may be the same as the material of the barrier layer, in this case, since the isolation dielectric layer has a certain thickness, when etching the barrier layer to form the second contact hole, even if the second contact hole is very close to the gate and thus part of the isolation dielectric layer is etched in thickness when etching the barrier layer, part of the isolation dielectric layer can still be retained in thickness by controlling the thickness of the isolation dielectric layer in advance after undergoing the etching of the barrier layer, so that an isolation zone is formed between the gate and the contact hole to reduce the possibility of short-circuit occurring between the gate and the second contact hole.

In other embodiments of the gate stack structure of the present invention, preferably, the material of the isolation dielectric layer 164 is different from the material of the barrier layer, that is, if the material of the barrier layer is silicon nitride, the material of the isolation dielectric layer 164 may be selected to be undoped silicon dioxide. In this case, when etching the barrier layer, since the same etchant (e.g. etching gas or etching solution) has different etching rates on different materials, an etchant that etches the barrier layer material faster but etches the isolation dielectric layer material slower may be used to etch the barrier layer. Thus the isolation dielectric layer is relatively lightly etched and a better effect of isolation can be achieved. In other words, by making the material of the isolation dielectric layer to be different from the material of the barrier layer, the damage to the isolation dielectric layer can be minimized when etching the barrier layer to form the second contact hole, which facilitates to ensure isolation effect between the gate and the second contact hole.

Figure 5:
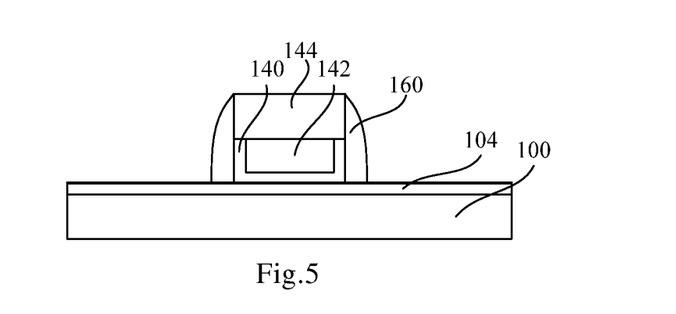
FIG. 5 is a structure schematic view of the first embodiment of the gate stack structure of the present invention in the connection region.

It shall be noted that in the present embodiment, the isolation dielectric layer is only located on the active region, as shown in FIG. 5, in this case, the gate stack structure located on the connection region only comprises: the gate formed on the connection region 104 (the material in the connection region 104 which is in contact with the gate is usually a shallow trench isolation material, such as updoped silicon dioxide, etc.), and a sidewall spacer 160 surrounding the gate. The gate comprises a work function metal layer 140, a metal layer 142 and an auxiliary metal layer 144, wherein the work function metal layer 140 being formed on the gate dielectric layer 120 and extending toward the inner wall of the sidewall spacer 160, the metal layer 142 being formed on the work function metal layer 140, and the auxiliary metal 144 being formed on the metal layer 142 and having a resistivity smaller than that of the metal layer 142. In other words, the gate stack structure located on the connection region 104 does not comprise the isolation dielectric layer. Therefore, when etching the second contact hole afterwards using the dual-contact-hole process, the second contact hole connected to the gate and the second contact hole connected to the first contact hole are formed synchronously, and no change is made to the gate stack structure located on the connection region 104, so a better compatibility will be achieved between the gate stack structure into which a new structure is introduced and the dual-contact-hole process.

However, in other embodiments of the gate stack structure of the present invention, the gate stack structure located on the connection region 104 may also comprise the isolation dielectric layer; only the thickness of the isolation dielectric layer on the active region should be greater than that of the isolation dielectric layer on the connection region. In this case, the isolation dielectric layer is introduced into the gate stack structure located on the connection region 104, which results in that the thickness to be removed of the dielectric layer are different when etching the second contact hole connected to the gate and the second contact hole connected to the first contact hole, i.e. when etching the second contact hole connected to the first contact hole, only the interlayer dielectric layer and barrier layer formed on the first contact hole need to be removed, while when etching the second contact hole connected to the gate, the isolation dielectric layer formed on the gate needs to be removed in addition to the interlayer dielectric layer and barrier layer formed on the gate. Even so, the gate stack structure having a new structure introduced thereinto can still be made to be compatible with the dual-contact-hole process by adjusting the process of forming the isolation dielectric layer. When etching the second contact hole connected to the first contact hole, in order to optimize the etching effect, an overetching operation is usually performed, so that the isolation dielectric layer is removed during the overetching by making the isolation dielectric layer formed on the gate on the connection region as thin as possible (even if the isolation dielectric layer and the barrier layer are of different materials, and the etchant used have different etching effects on the isolation dielectric layer and the barrier layer, the etchant for removing the material of the barrier layer will always etch the isolation dielectric layer material to some extent, so the removal of the isolation dielectric layer can be realized as long as the isolation dielectric layer is as thin as possible. Moreover, in order to form the isolation dielectric layers of different thickness on the active region and the connection region, the thickness of the gates removed in advance are different, in this case, the gates of different thickness can be removed by a single-mask-multiple-etching-depths process. Here, said single-mask-multiple-etching-depths process refers to forming patterns of different grey scales in one piece of mask and pattern of each grey scale can be used to etch material having a single thickness). Hence, the gate stack structure having a new structure introduced thereinto can be compatible with the dual-contact-hole process.

Figure 6:
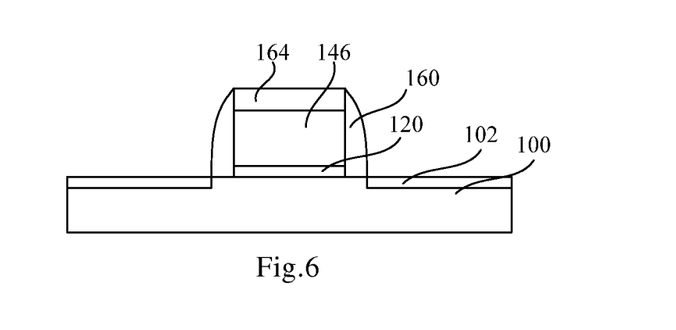
FIG. 6 is a structure schematic view of a second embodiment of the gate stack structure of the present invention in the active region.

As shown in FIG. 6, in the second embodiment of the gate stack structure of the present invention, the gate stack structure comprises: a gate dielectric layer 120 formed on a substrate 100, a gate formed on the gate dielectric layer 120, and a sidewall spacer 160 surrounding the gate dielectric layer 120 and the gate. The gate comprises polysilicon 146 (preferably doped polysilicon), and an isolation dielectric layer 164 is formed on the gate. The sidewall spacer 160 covers the opposite side faces of the isolation dielectric layer 164.

The processing needed for forming the substrate and formation of the gate dielectric layer 120, the gate and the sidewall spacer 160 can be performed using conventional technologies. A contact region 102 is also formed on the substrate 100. Dry etching techniques such as reactive ion etching (RIE) or wet etching techniques may be used to remove part of the polysilicon 146 in thickness. The part of the polysilicon 146 that is to be removed in thickness can be determined flexibly according to the device performance and process requirements, as long as the part of the polysilicon 146 removed in thickness can provide an accommodation space in which the isolation dielectric layer 164 is formed so as to form an additional isolation zone between the gate and the contact hole.

Figure 7:
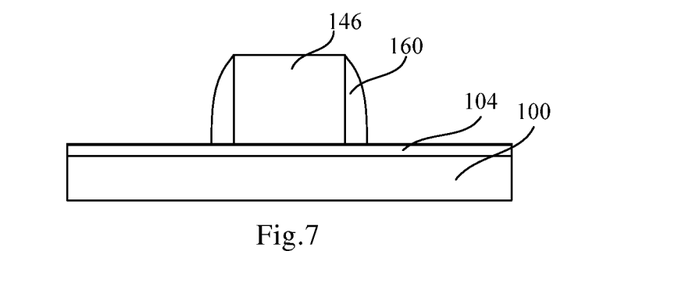
FIG. 7 is a structure schematic view of the second embodiment of the gate stack structure of the present invention in the connection region.

It shall be noted that in the present embodiment, the isolation dielectric layer is only located on the active region, as shown in FIG. 7, in this case, the gate stack structure located on the connection region only comprises: a gate formed on the connection region 104 and a sidewall spacer 160 surrounding the gate. The gate comprises a polysilicon 146 (preferably a doped polysilicon).

The isolation dielectric layer may be one of silicon nitride, silicon carbon nitride, doped or undoped silicon oxide glass (e.g. fluorosilicate glass, borosilicate glass, phosphosilicate glass, boron-phosphorosilicate glass, silicon oxycarbide, silicon carbon oxynitride, etc.) and dielectric material of a low dielectric constant (e.g. framesite, coral, etc.), or any combination thereof. The ratio between the thickness of the isolation dielectric layer and the height of the sidewall spacer may be greater than or equal to 15%. The material of the isolation dielectric layer may be the same as or different from the material of the barrier layer. The isolation dielectric layer may be located only on the active region or be located on both the active region and the connection region; only the thickness of the isolation dielectric layer on the active region is greater than that of the isolation dielectric layer on the connection region. The ratio between the thickness of the isolation dielectric layer and the height of the sidewall spacer may be greater than or equal to 15%. The detailed reason for this is as described in the above embodiment and will not be repeated here.

By embedding the isolation dielectric layer into the gate, and making the sidewall spacer cover the opposite side faces of the isolation dielectric layer, the isolation dielectric layer located on the active region is thicker than the isolation dielectric layer on the connection region, in other words, the gate located on the active region is thinner than the gate located on the connection region, thereby increasing the vertical distance between the gate on the active region and the second contact hole, and forming an isolation zone between the gate and the second contact hole to reduce possibility of short-circuit occurring between the gate and the second contact hole. Meanwhile, for the gate located on the connection region, the thickness of the isolation dielectric layer formed on said gate is adjusted to be as small as possible, so that the process can be compatible with the dual-contact-hole process when etching the second contact hole.

It shall be noted that with the development of technology, other substitute materials than metal or polysilicon can be used to form the gate, and under the teaching of the above embodiments, those skilled in the art can flexibly apply the technical solution of the present invention using such substitute materials, which will not be repeated here.

The present intention also provides a method for manufacturing the gate stack structure.

Figure 8:
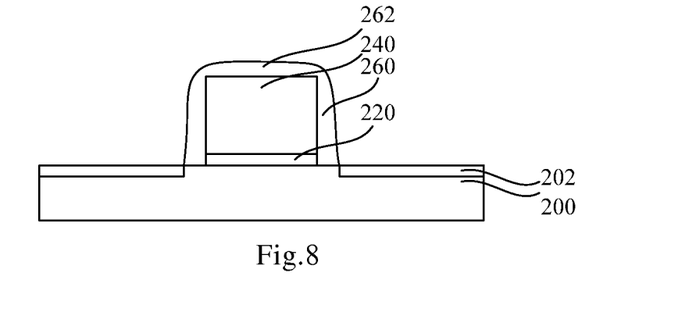
FIGS. 8-16 are schematic views of the intermediate structures when implementing the steps of the first embodiment of manufacturing method of the gate stack structure of the present invention.

Specifically, in the first embodiment of the manufacturing method, the manufacturing method comprises:

First, as shown in FIG. 8, forming, on the substrate 200, the gate dielectric layer 220, the dummy-gate 240, the lightly doped drain region (not shown), the sidewall spacer 260 surrounding the dummy-gate 240 and the gate dielectric layer 220, a cap layer 262 covering the dummy-gate 240, and source and drain regions (not shown) and a contact region 202.

Here, the substrate 200 refers to the substrate that has been subjected to a processing including precleaning, forming a well region and forming a shallow trench isolation region. The substrate may comprise a silicon wafer or other compound semiconductors, such as silicon carbide, gallium arsenide, indium arsenide, or indium phosphide. In addition, the substrate optionally comprises an epitaxial layer. The substrate may also comprise a silicon-on-insulator (SOI) structure.

The gate dielectric layer 220 may use a hafnium-based material, such as one of $HfO_2$, HfSiO, HfSiON, HfTaO, HfSiO and HfZrO, or any combination thereof. The sidewall spacer 260 and the cap layer 262 covering the dummy-gate may each include one of silicon nitride, silicon oxide, silicon oxynitride, and silicon carbide, or any combination thereof. The sidewall spacer 260 may have a multi-layer structure. The dummy-gate 240 may use polysilicon or amorphous silicon. Conventional technologies may be used to perform the above-mentioned processing and to form the gate dielectric layer 220, the sidewall spacer 260, the dummy-gate 240, the cap layer 262 covering the dummy-gate 240 as well as the lightly doped drain region, the source and drain regions and the contact region 202. The contact region 202 is mostly a metal silicide so as to realize a better contact between the silicon and the subsequently deposited conductive material when adopting the silicon substrate. The metal material formed on the substrate in order to form the metal silicide includes one of Co, Ni, Mo, Pt and W, or any combination thereof.

Figure 9:
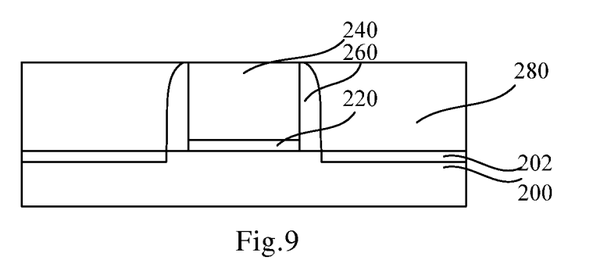

Next, as shown in FIG. 9, an interlayer dielectric layer 280 is formed on the substrate 200 that has been subjected to the above-mentioned processing, and then, the interlayer dielectric layer 280 is planarized and the cap layer 262 covering the dummy-gate 240 is removed to expose the dummy-gate 240.

The interlayer dielectric layer 280 may be formed using CVD and/or other appropriate technologies. Said interlayer dielectric layer 280 comprises one of silicon oxide, fluorosilicate glass, borosilicate glass, phosphosilicate glass, boron-phosphorosilicate glass, and a low-k dielectric material (e.g. framesite, coral, etc.), or any combination thereof. The interlayer dielectric layer 280 may have a multi-layer structure. Chemical mechanical polishing (CMP), for example, may be used to planarize the interlayer dielectric layer 280 and to remove the cap layer 262 covering the dummy-gate 240.

Figure 10:
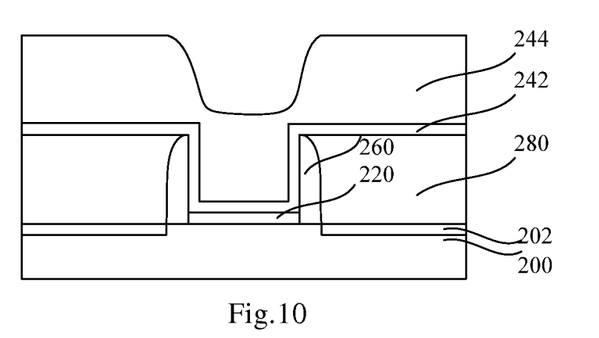

Subsequently, as shown in FIG. 10, the dummy-gate 240 is removed to obtain a gate space surrounded by the inner walls of the sidewall spacer 260, and a work function metal layer 242 and a metal layer 244 are formed successively to fill up the gate space.

Dry etching techniques such as reactive ion etching (RIE) or wet etching techniques may be used to remove the dummy-gate 240. After removing the dummy-gate 240, it may be selected flexibly according to the process requirements to retain the gate dielectric layer 220 or to remove the gate dielectric layer 220 so as to re-form the gate dielectric layer 220 to optimize the device performance.

The work function metal layer 242 may include one of TiN, TiAlN, TaN and TaAlN, or any combination thereof. The metal layer 244 may include one of Al, Ti, Ta, W and Cu, or any combination thereof. The work function metal layer 242 and the metal layer 244 can be formed by sputtering, PLD, MOCVD, ALD, PEALD or other appropriate technologies.

Figure 11:
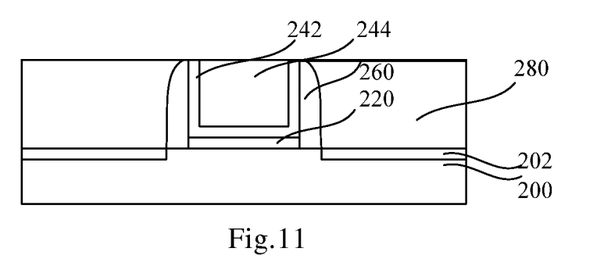

Afterwards, as shown in FIG. 11, the work function metal layer 242 and the metal layer 244 located outside of the gate space are removed.

The work function metal layer 242 and the metal layer 244 located outside of the gate space can be removed by, for example, chemical mechanical polishing (CMP).

Figure 12:
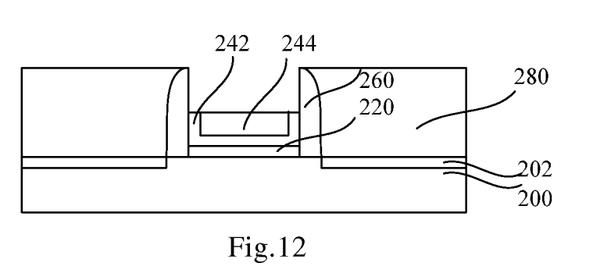

Then, as shown in FIG. 12, part of the work function metal layer 242 and the metal layer 244 inside the gate space are removed in thickness.

Dry etching techniques such as reactive ion etching (RIE) or wet etching techniques may be used to remove the part of the work function metal layer 242 and the metal layer 244 in thickness inside the gate space.

Figure 13:
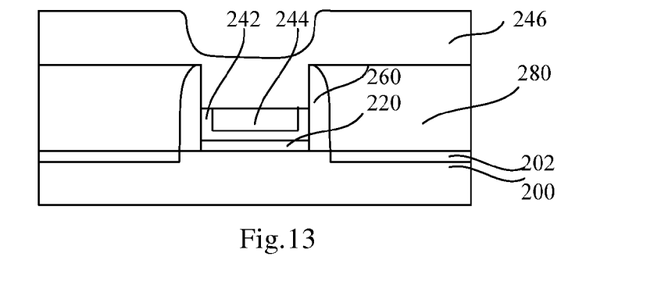

Subsequently, as shown in FIG. 13, an auxiliary metal layer 246 is formed on the metal layer 244, and the resistivity of the auxiliary metal layer 246 is smaller than that of the metal layer 244.

The auxiliary metal layer 246 may be formed by sputtering, PLD, MOCVD, ALD, PEALD or other appropriate technologies. The auxiliary metal layer 246 may comprise one of Al, Ti, Ta, W and Cu, or any combination thereof.

Figure 14:
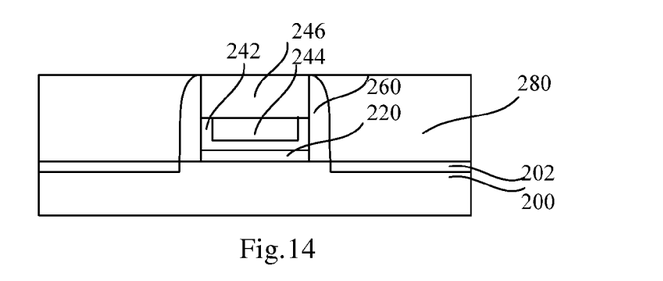

Then, as shown in FIG. 14, the auxiliary metal layer 246 outside of the gate space is removed.

The auxiliary metal layer 246 outside of the gate space can be removed by, for example, chemical mechanical polishing (CMP).

Figure 15:
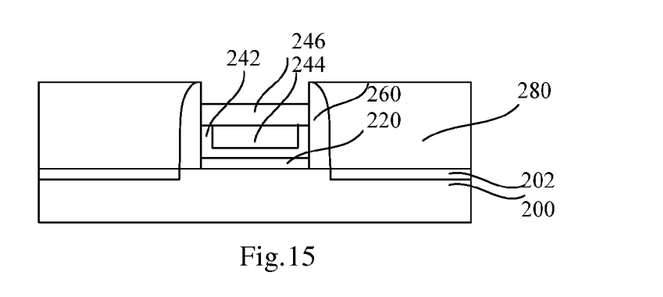

Next, as shown in FIG. 15, part of the auxiliary metal layer 246 inside the gate space and in the active region is removed in thickness to expose the opposite inner walls of the sidewall spacer.

Dry etching techniques such as reactive ion etching (RIE) or wet etching techniques may be used to remove the part of the auxiliary metal layer 246 in thickness inside the gate space. The part of the auxiliary metal layer 246 that is to be removed in thickness can be determined flexibly according to the device performance and process requirements, as long as the part of the auxiliary metal layer 246 removed in thickness can provide an accommodation space in which an isolation dielectric layer 264 is formed so as to form an additional isolation zone between the gate and the second contact hole.

Figure 16:
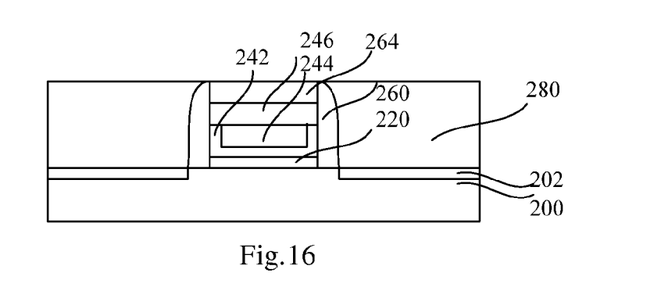
Figure 17:
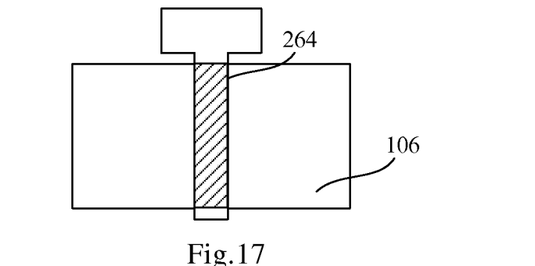
FIGS. 17-18 are top views of the structures obtained from implementing the first embodiment of manufacturing method of the gate stack structure of the present invention.

Finally, as shown in FIG. 16, an isolation dielectric layer 264 is formed on the auxiliary metal layer 246, and the isolation dielectric layer 264 covers the exposed inner walls. After removing the isolation dielectric layer 264 outside of the gate space, operations like forming the interlayer dielectric layer and the second contact hole may be performed. In this case, as shown in FIG. 17, the isolation dielectric layer 264 is formed only on the active region 106.

The isolation dielectric layer 264 may be one of silicon nitride, silicon carbon nitride, doped or undoped silicon oxide glass (e.g. fluorosilicate glass, borosilicate glass, phosphosilicate glass, boron-phosphorosilicate glass, silicon oxycarbide, or silicon carbon oxynitride, etc.) and dielectric material of a low dielectric constant (e.g. framesite, coral, etc.), or any combination thereof. The isolation dielectric layer 264 may be formed by CVD, PLD, ALD, or PEALD and so on.

It shall be noted that in the present embodiment, the auxiliary metal layer 246 is used for reducing the gate resistance. As an example, the ratio between the thickness of the auxiliary metal layer 144 and the height of the sidewall spacer 160 may be greater than or equal to 20%, and the ratio between the thickness of the isolation dielectric layer 164 and the height of the sidewall spacer 160 may be greater than or equal to 15% in the present embodiment. In other embodiments of the gate stack structure, the gate may include only the work function metal layer 242 and the metal layer 244. In this case, part of the work function metal layer 242 and the metal layer 244 may be removed in thickness by dry etching techniques such as reactive ion etching (RIE) or wet etching techniques, so that the isolation dielectric layer 264 is formed on the gate on the active region (in this case, the ratio between the thickness of the isolation dielectric layer 264 and the height of the sidewall spacer 160 is greater than or equal to 15%), and the sidewall spacer 260 covers the opposite side faces of the isolation dielectric layer 264. The part of the work function metal layer 242 and the metal layer 244 that is to be removed in thickness can be determined flexibly according to the device performance and process requirements, as long as the part of the work function metal layer 242 and the metal layer 244 removed in thickness can provide an accommodation space in which the isolation dielectric layer 264 is formed so as to form an additional isolation zone between the gate and the second contact hole.

After forming the gate stack structure, in order to form the semiconductor device, a barrier layer, an interlayer dielectric layer and a second contact hole embedded into the barrier layer and the interlayer dielectric layer need to be further formed. The barrier layer will cover the isolation dielectric layer, and the material of the barrier layer may be silicon nitride or silicon carbon nitride.

In the present embodiment, the material of the isolation dielectric layer may be the same as the material of the barrier layer, in this case, since the isolation dielectric layer has a certain thickness, when etching the barrier layer to form the second contact hole, even if the second contact hole is very close to the gate and thus part of the isolation dielectric layer is etched in thickness when etching the barrier layer, part of the isolation dielectric layer can still be retained in thickness by controlling the thickness of the isolation dielectric layer in advance after undergoing the etching of the barrier layer, so that an isolation zone is formed between the gate and the contact hole to reduce the possibility of short-circuit occurring between the gate and the second contact hole.

In other embodiments of the gate stack structure of the present invention, preferably, the material of the isolation dielectric layer is different from the material of the barrier layer. In this case, when etching the barrier layer, since the same etchant (e.g. etching gas or etching solution) has different etching rates on different materials, an etchant that etches the barrier layer material faster but etches the isolation dielectric layer material slower may be used to etch the barrier layer. Thus the isolation dielectric layer is relatively lightly etched and a better effect of isolation can be achieved. In other words, by making the material of the isolation dielectric layer to be different from the material of the barrier layer, the damage to the isolation dielectric layer can be minimized when etching the barrier layer to form the second contact hole, which facilitates to ensure isolation effect between the gate and the second contact hole.

Figure 18:
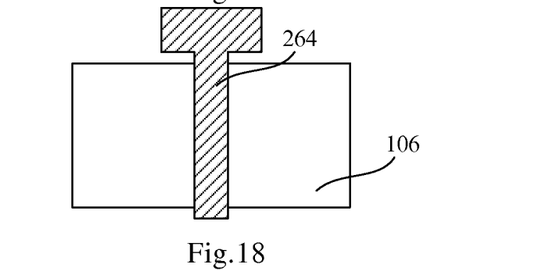

It shall be noted that in other embodiments of the present embodiment, as shown in FIG. 18, after removing the part of the auxiliary metal layer 246 in thickness inside the gate space on the active region, part of the auxiliary metal layer 246 inside the gate space on the connection region may also be removed in thickness, but the removed thickness on the active region needs to be greater than the removed thickness on the connection region so as to expose the opposite inner walls of the sidewall spacer. In this case, the isolation dielectric layer 264 is formed on both the active region and the connection region.

Introducing the isolation dielectric layer into the gate stack structure located on the connection region will result in that the thickness to be removed of the dielectric layer are different when etching the second contact hole connected to the gate and the second contact hole connected to the first contact hole, i.e. when etching the second contact hole connected to the first contact hole, only the interlayer dielectric layer and barrier layer formed on the first contact hole need to be removed, while when etching the second contact hole connected to the gate, the isolation dielectric layer formed on the gate needs to be removed in addition to the interlayer dielectric layer and barrier layer formed on the gate. Even so, the gate stack structure having a new structure introduced thereinto can still be made to be compatible with the dual-contact-hole process by adjusting the process of forming the isolation dielectric layer. When etching the second contact hole connected to the first contact hole, in order to optimize the etching effect, an overetching operation is usually performed, so that the isolation dielectric layer is removed during the overetching by making the isolation dielectric layer formed on the gate on the connection region as thin as possible (even if the isolation dielectric layer and the barrier layer are of different materials, and the etchant used have different etching effects on the isolation dielectric layer and the barrier layer, the etchant for removing the material of the barrier layer will always etch the isolation dielectric layer material to some extent, so the removal of the isolation dielectric layer can be realized as long as the isolation dielectric layer is as thin as possible. Moreover, in order to form the isolation dielectric layers of different thickness on the active region and the connection region, the thickness of the gates removed in advance are different, in this case, the gates of different thickness can be removed by a single-mask-multiple-etching-depths process). Hence, the gate stack structure having a new structure introduced thereinto can be compatible with the dual-contact-hole process.

But when removing part of the auxiliary metal layer in thickness inside the gate space, no change is made to the gate on the connection region. The second contact hole connected to the gate and the second contact hole connected to the first contact hole are formed synchronously, so a better compatibility will be achieved between the gate stack structure into which a new structure is introduced and the dual-contact-hole process.

Figure 19:
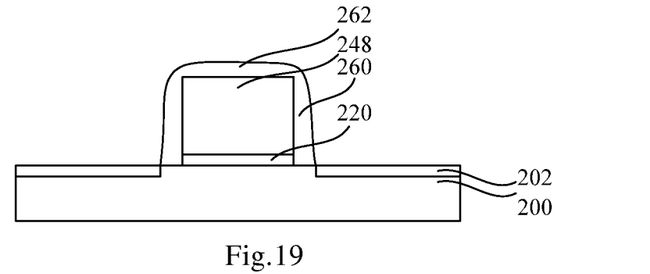
FIGS. 19-21 are schematic views of the intermediate structures when implementing the steps of the second embodiment of manufacturing method of the gate stack structure of the present invention.

In the second embodiment of the manufacturing method, the manufacturing method comprises:

First, as shown in FIG. 19, forming, on the substrate 200, the gate dielectric layer 220, a polysilicon gate 248, the lightly doped drain region (not shown), a sidewall spacer 260 surrounding the polysilicon gate 248 and the gate dielectric layer 220, a cap layer 262 covering the polysilicon gate 248, and the source and drain regions (not shown) and the contact region 202.

The polysilicon gate 248 may be formed by a conventional process.

Figure 20:
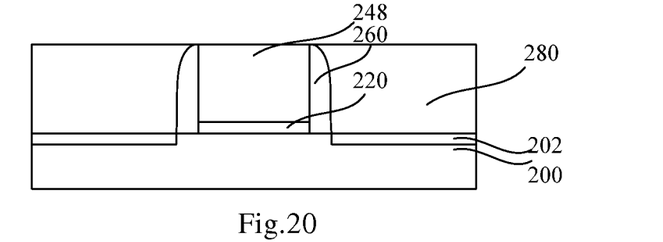

Next, as shown in FIG. 20, forming an interlayer dielectric layer 280 on the substrate 200 that has been subjected to the above-mentioned processing, then, planarizing the interlayer dielectric layer 280 and removing the cap layer 262 covering the polysilicon gate 248 to expose the polysilicon gate 248.

The planarization operation may be performed by such technologies as chemical mechanical polishing (CMP).

Figure 21:
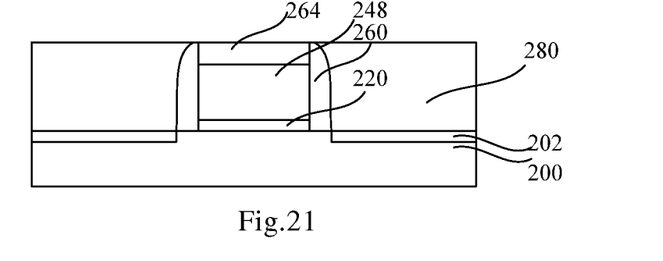

Finally, as shown in FIG. 21, removing part of the polysilicon gate 248 in thickness in the active region, and forming an isolation dielectric layer 264 on the polysilicon gate 248, the sidewall spacer 260 covering opposite side faces of the isolation dielectric layer 264.

Dry etching techniques such as reactive ion etching (RIE) or wet etching techniques may be used to remove the part of the polysilicon gate 248 in thickness. The part of the polysilicon gate 248 that is to be removed in thickness can be determined flexibly according to the device performance and process requirements (the ratio between the part of the thickness of the polysilicon gate 248 that is removed and the height of the sidewall spacer 260 is greater than or equal to 15%), as long as the polysilicon gate 248 having part of the thickness removed can provide an accommodation space which can be used to form an additional isolation zone between the gate and the contact hole. The operation of forming the isolation dielectric layer 264 is the same as that described in the previous embodiment, and will not be repeated here.

It shall be noted that in other embodiments of the present invention, when or after removing part of the polysilicon gate 248 in thickness inside the gate space on the active region, part of the polysilicon gate 248 inside the gate space on the connection region may also be removed in thickness, but the removed thickness on the active region should be made to be greater than the removed thickness on the connection region so as to expose the opposite inner walls of the sidewall spacer. The detailed reason for this is as described in the above embodiment and will not be repeated here.

By embedding the isolation dielectric layer into the gate, and making the sidewall spacer cover the opposite side faces of the isolation dielectric layer, the isolation dielectric layer located on the active region is thicker than the isolation dielectric layer on the connection region, in other words, the gate located on the active region is thinner than the gate located on the connection region, thereby increasing the vertical distance between the gate on the active region and the second contact hole, and forming an isolation zone between the gate and the second contact hole to reduce possibility of short-circuit occurring between the gate and the second contact hole. Meanwhile, for the gate located on the connection region, the thickness of the isolation dielectric layer formed on said gate is adjusted to be as small as possible, so that the process can be compatible with the dual-contact-hole process when etching the second contact hole.

The present invention also provides a semiconductor device, which comprises the gate stack structure as described in the previous embodiments.

The present invention also provides a method for manufacturing the semiconductor device, which comprises:
forming a gate stack structure on the substrate;
forming a metal interconnection on the substrate on which the gate stack structure is formed; wherein, the gate stack structure is formed using the method described in the above embodiments. Said method will not be repeated here.

In addition, the scope to which the present invention is applied is not limited to the process, mechanism, manufacture, material composition, means, methods and steps described in the specific embodiments in the specification. Those skilled in the art would readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the teaching of the present invention without departing from the protection scope thereof.

What is claimed is:

1. A gate stack structure, comprising:
a gate dielectric layer formed on an active region and on a connection region in a substrate;
a gate formed on the gate dielectric layer; and
a sidewall spacer surrounding the gate dielectric layer and the gate;
wherein the gate stack structure further comprising:
an isolation dielectric layer formed on the gate,
and wherein the sidewall spacer covers opposite side faces of the isolation dielectric layer, and the isolation dielectric layer located on the active region is thicker than the isolation dielectric layer located on the connection region.

2. The gate stack structure according to claim 1, characterized in that the isolation dielectric layer is only located on the active region.

3. The gate stack structure according to claim 1, characterized in that the isolation dielectric layer is one of silicon nitride, silicon carbon nitride, doped or undoped silicon oxide glass, and dielectric materials of a low dielectric constant, or any combination thereof.

4. A semiconductor device, characterized in that the semiconductor device comprises the gate stack structure according to claim 1.

5. A method for manufacturing a gate stack structure, comprising the steps of: forming a gate dielectric layer, a gate formed on the gate dielectric layer, and a sidewall spacer surrounding the gate dielectric layer and the gate on a substrate including an active region and a connection region;
wherein the method further comprising:
removing part of the gate in thickness, wherein the thickness of the removed part of the gate on the active region is greater than the thickness of the removed part of the gate on the connection region so as to expose opposite inner walls of the sidewall spacer; and
forming an isolation dielectric layer on the gate to cover the exposed inner walls.

6. The method according to claim 5, characterized in that the step of removing part of the gate in thickness comprises only removing part of the gate in thickness located on the active region.

7. The method according to claim 5, characterized in that the isolation dielectric layer is one of silicon nitride, silicon carbon nitride, doped or undoped silicon oxide glass, and dielectric material of a low dielectric constant, or any combination thereof.

8. A method for manufacturing a semiconductor device, comprising the steps of:
forming a gate stack structure on a substrate; and
forming a metal interconnection on the substrate having the gate stack structure is formed;
wherein the gate stack structure is formed using the method according to claim 5.

* * * * *

UNITED STATES PATENT AND TRADEMARK OFFICE
CERTIFICATE OF CORRECTION

PATENT NO. : 8,969,930 B2
APPLICATION NO. : 13/321886
DATED : March 3, 2015
INVENTOR(S) : Yin et al.

Page 1 of 1

It is certified that error appears in the above-identified patent and that said Letters Patent is hereby corrected as shown below:

On the title page, item (75) Inventors: Haizhoou Yin should read --Haizhou Yin--.

Signed and Sealed this
Sixteenth Day of June, 2015

Michelle K. Lee
*Director of the United States Patent and Trademark Office*